United States Patent [19]

Stachurski

[11] 4,125,122
[45] Nov. 14, 1978

[54] DIRECT ENERGY CONVERSION DEVICE

[76] Inventor: John Z. O. Stachurski, 200 W. 15th St., Apt. 14E, New York, N.Y. 10011

[21] Appl. No.: 603,299

[22] Filed: Aug. 11, 1975

Related U.S. Application Data

[63] Continuation-in-part of Ser. No. 350,407, Aug. 12, 1975, Pat. No. 3,899,359.

[51] Int. Cl.² ............................................. H01L 35/30
[52] U.S. Cl. ..................................... 136/205; 136/210; 136/212; 136/218
[58] Field of Search ................. 136/205, 210, 212, 218

[56] References Cited

U.S. PATENT DOCUMENTS

| 3,116,167 | 12/1963 | Talaat | 136/210 |
| 3,356,539 | 12/1967 | Stachurski | 136/205 |
| 3,834,171 | 9/1974 | Johansson | 136/210 |

Primary Examiner—Maynard R. Wilbur
Assistant Examiner—Richard E. Berger

[57] ABSTRACT

A method and apparatus are described for directly converting heat to electricity within an array of thermoelements and heat pipes. The thermoelectric generator contains two conduits for two fluid streams, and a plurality of thermal bridges connecting points in both fluid streams, placing them in an overall counterflow heat exchange relationship. Each thermal bridge comprises at least one heat exchange surface with the first fluid stream, at least one heat exchange surface with the second fluid stream and at least one heat pipe, delivering heat to and/or from the thermoelectric element. The rapid heat delivery capability of the heat pipes, in combination with the counterflow heat exchange relationship between the two fluid streams within the generator, are responsible for the simultaneous considerable improvement of efficiency and power density of the generator.

11 Claims, 8 Drawing Figures

DIRECT ENERGY CONVERSION DEVICE

This application is a continuation-in-part of a U.S. patent for a thermoelectric generator by John Z. O. Stachurski, bearing Ser. No. 350,407, filed April 12, 1973, now patent No. 3,899,359, issued on Aug. 12, 1975.

This invention relates to the method and apparatus for direct conversion of heat to electricity, with an integrated system of thermoelectric elements and heat pipes.

In a thermoelectric generator of conventional design, a plurality of thermocouples is selectively disposed between the heat source and heat sink.

A thermocouple may be defined as a system comprising semiconducting materials of two types, N and P, the N-material being characterized by negative values of the Seebeck coefficient, the P-material by positive values, arranged into two legs, with two metallic electrodes at the end of each leg, and a metallic connector connecting the two legs electrically in series. Thermally the two legs are connected in parallel.

The N-thermoelement shall be defined here as a single piece of N-semiconductor with two metallic electrodes joined to it at opposite ends. A P-thermoelement is defined similarly. In the simplest case the thermoelement is identical with one leg of the thermocouple.

A heat pipe is a device capable of very rapid heat transport, comprising an elongated container, a working fluid and a porous wick. The working fluid is evaporated at one end of the pipe, is flowed to and condensed at the other end and is returned to the initial location by the capillary forces between the wick and the condensed fluid.

The maximum efficiency of heat to electricity conversion in a thermoelectric generator of conventional design is primarily determined by the properties of the N and P materials used to fabricate its N and P thermoelements. During the electricity producing flow of heat from the heat source to the heat sink across the thermoelement, most of the heat is lost in the heat sink without being converted to electricity. This is the cause of the low efficiency of the process.

In the thermoelectric generator described in U.S. Pat. No. 3,899,359 by Stachurski, a method is given in which two counterflowing fluids, hot and cold, exchange heat while generating temperature differences between the junctions of thermoelements in such a manner that the heat, after passing through a thermoelement, is recovered and transferred back to the heat source against the temperature gradient. This improves the efficiency of the heat to electricity conversion very considerably.

A thermoelectric generator, in order to be a practical and useful device, has to convert energy not only efficiently but also at a large power density.

The power density of a thermoelement is defined as the power generated in the thermoelement per unit area of its cold junction.

When the junctions of the thermoelement are maintained at temperatures $T_1$ and $T_2$ while the distance (L) between the junctions is being decreased, then the power density will increase in inverse proportion to L. Thus very high power densities can be obtained for very small distances between the junctions of the thermoelements.

It is very difficult to maintain temperatures $T_1$ and $T_2$ constant while decreasing L because this necessitates a very considerable increase in the rate of heat delivery to the hot junction and heat removal from the cold junction.

In the thermoelectric generator of the present invention, high efficiency and high power density are achieved simultaneously. The generator is arranged as an overall counterflow heat exchanger, allowing two fluid streams to pass. The first stream carries heat from the heater and the second stream enters the system cold and gradually absorbs heat from a number of thermal bridges that thermally connect both fluid streams.

A thermal bridge typically would consist of a high surface area heat exchange surface capable of rapid absorption of heat from the first fluid stream, a heat pipe that transfers heat rapidly to the hot junctions of suitably disposed thermoelements, maintaining the said hot junctions at a constant and even temperature by a process of condensation of the working fluid, a plurality of thermoelements suitably connected to produce a high electrical current while the distances between the hot and cold junctions in individual thermoelements are small, and a heat pipe thermally connected to and removing heat rapidly from cold junctions of said thermoelements while maintaining them at nearly equal temperature, through a continuous process of evaporation of a working fluid, said heat pipe rejecting heat to the second fluid stream through a high surface area of contact.

The second fluid stream which was initially cold collects heat step by step from thermal bridges and becomes hot before it reaches the heater.

Since the above described thermal bridge can flow heat at very high rates, even when the temperature difference between its ends is very small, the total temperature difference between the heater and cooler can be split into a very large number of thermal bridges, each operating on a very small temperature difference. Thus the use of heat pipes allows the realization of not only an improvement in power but also an additional improvement in efficiency.

Further improvement of both efficiency and power density will occur when consecutive thermal bridges operating at various temperatures will have thermoelements made of different thermoelectric materials, so chosen that the maximum value of their Seebeck coefficient will correspond to the mean temperature of the thermoelement.

A particularly useful embodiment of the thermoelectric generator of the present invention is created when the first fluid stream and the second fluid stream are connected within a totally enclosed and sealed system. The condensed second fluid stream is delivered to a wick which is in thermal contact with the heater. The second fluid evaporates from the wick, becoming the first fluid, moves toward the area of the hottest of the thermal bridges where it condenses, the proceeds toward the cooler area and becomes the second fluid.

It is accordingly an object of the present invention to provide a thermoelectric generator of high efficiency.

It is another object of the present invention to provide a thermoelectric generator of high power density.

It is still another object of the present invention to provide a thermoelectric generator of great mechanical integrity.

It is another object of this invention to provide a thermoelectric generator capable of operating in a totally sealed system without moving parts.

It is further an object of the invention to provide a thermoelectric generator capable of converting radiation (solar) energy to electrically efficiently and at high power density.

Other advantages and objects of the thermoelectric generator in accordance with the invention may be understood from the following description of several embodiments in conjunction with the drawings wherein FIG. 1 is a diagrammatic view of a thermoelectric generator in accordance with the invention;

Figure 1:
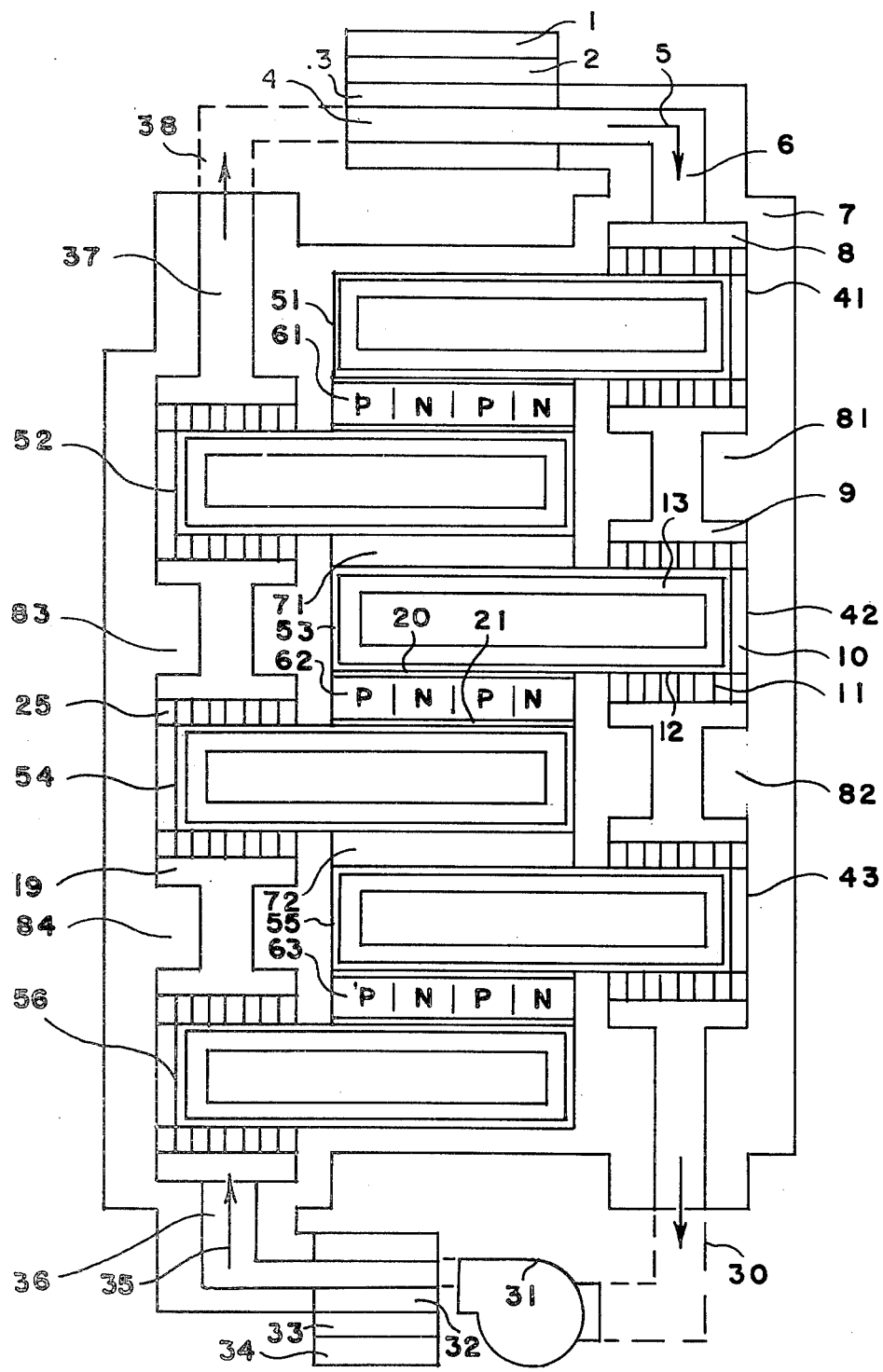
Figure 2:
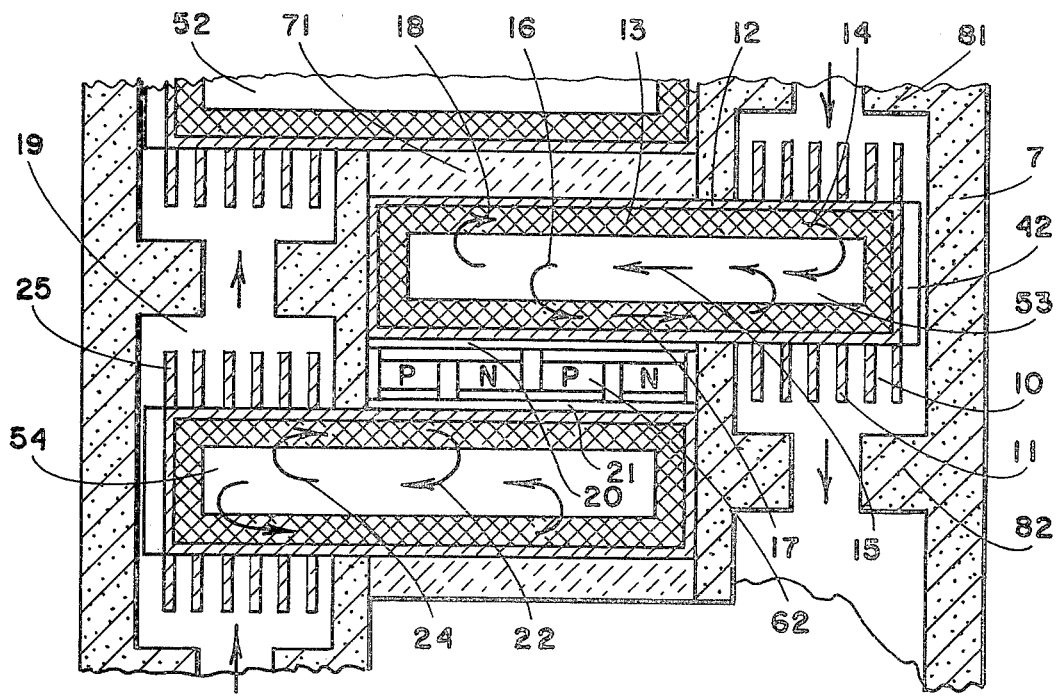
FIG. 2 is a sectional and more detailed view of a part of the generator shown in FIG. 1, illustrating the thermal bridge and its components.

Referring now to the drawings and first, particularly, to FIGS. 1 and 2 thereof, wherein like numbers designate like components, thermal energy is generated in a heat source 1, such as a chemical reactor (burner), nuclear reactor or the sun and delivered by heat delivery means 2 such as a circulating liquid, a heat pipe or a solar concentrator, to the heat collector 3. The heat collector absorbs delivered and concentrated thermal energy and exchanges it with the heated first fluid stream 4, its direction being indicated by arrow 5.

The first fluid stream represents a stream of thermally stable gas, vapor or liquid of relatively low viscosity, high heat capacity and low thermal conductivity, which serves as a dynamic heat transfer medium. Said fluid can circulate in the system or just flow through it. Numerous groups of substances are suitable for the purpose. For example, some inorganic salts such as $SnCl_2$ (melting point 247° C., boiling point 623° C.) and their eutectic mixtures such as $KCl-SnCl_2$ eutectic (melting point 180° C.) make good circulating fluids when operated in the molten state. Certain organic compounds are also useful, for example a family of fluoroethers (general formula: $F(C(CF_3)FCF_2O)_nCHFCF_3$ where $n$ equals 1 to 7) commercially known as Freon E can be operated as the heat transfer liquid from room temperature to 350° C. at 100 P.S.I.). Liquid metals can be used for the same purpose, but require an additional thermal insulation device to minimize the effect of their high thermal conductance on thermal losses to the heat sink.

Returning to FIG. 1, the hot first fluid proceeds along the passage 6 in a thermally insulated housing 7, where insulation is accomplished by the use of high temperature materials like fibrous or foamy silica, mixtures or refractory oxides and silicates in combination with thin metallic layers, reflecting the infrared radiation.

Next the fluid enters chamber 8 in which the first thermal bridge 41 begins. There are three thermal bridges, 41, 42 and 43 in the generator in FIG. 1. As an example, heat tranfer in thermal bridge 42 will be considered here. At this point FIGS. 1 and 2 should be considered jointly. Part of the heat from the first fluid stream is absorbed by the heat exchange means 10, comprising for example numbers of metallic fins 11 or the like, attached to the hermetically sealed heat pipe container 12, made of stainless steel, molibdenum, copper alloys or other suitable metals. The container is lined with a wick 13, made of layers of stainless steel, molibdenum or copper woven mesh or sintered fibers. The wick carries the liquefied working fluid such as molten metals, (for example potassium), or molten salts like $SnCl_2$ or organic fluids like Freons or alcohols or water. After absorbing heat from the (hot) first fluid, the working fluid evaporates as indicated by arrow 14 (FIG. 2) and proceeds in the direction of arrow 15, (FIG. 2), condenses in the neighborhood of the thermoelements 62 as indicated by arrow 16 (FIG. 2) and releases heat there. It then returns along the wick to the evaporation area as shown by arrow 17 (FIG. 2). In order to increase the rate of heat exchange between the first and second fluid, a smaller portion of the vapor can be condensed on the upper wick as indicated by arrow 18 (FIG. 2) and the released heat can be delivered through the heat flow controlling plate 71 to the neighboring heat pipe 52 and to the cold fluid stream in chamber 19. The major portion of heat in the thermal bridge 42 flows through the set of thermoelements 62, separated from the heat pipes 53 and 54 by very thin layers 20 and 21 of material that is thermally well conducting but electrically insulating, such as boron nitride. A thermal gradient is then produced in the thermoelements, and consequently electricity is generated. The thermocouples 62 are electrically connected with thermocouples 61 and 63 and the the external load with connectors not shown in the drawings. The heat which was not converted to electricity in thermoelements 62 is absorbed by heat pipe 54. Evaporation of the working fluid in this pipe is represented by arrow 22 (FIG. 2). The vapor then condenses in the colder part of the heat pipe as indicated by arrow 24 (FIG. 2) and returns to the hotter part of the heat pipe along the wick. The heat of condensation is delivered through heat exchanging means (fins) 25 to the (cold) second fluid stream flowing through chamber 19 toward the heat source. An important role is played by the thermal insulation partitions 81 and 82 located between the chambers of the passage carrying the first fluid stream. Their task is to minimize the diffusion of heat in the first fluid directed from the hotter to the cooler chamber. Similar insulation particles in the second fluid passage are indicated by 83 and 84.

Consider now the flow of the (cold) second fluid stream. The second fluid stream may be simply identical with the first fluid after it lost most of its heat and in this case the already chilled first fluid is directed by connecting means 30 to the pumping means 31 and to the cooling heat exchanger 32 where the rest of its heat is extracted. This heat then is transferred through heat transfer means 33 like a heat pipe, circulating fluid or thermal conduction to the final heat sink 34, like ambient air, ambient water or space radiator.

The second fluid stream represented by arrow 35 then enters the beginning of the second fluid passage 36, comprising a number of connected chambers like chamber 19, each chamber containing an end of a thermal bridge. After collecting heat from all thermal bridges, the second fluid becomes hot and leaves at the outlet 37.

This outlet may or may not be connected by connecting means 38 to the inlet for the first fluid. If it is, then we have a closed flow system.

The first and the second fluids are not always chemically identical. For example, the first fluid can be an exhaust gas from a combustion process, while the second fluid constitutes air. In this case the second fluid becomes the first fluid and is rejected after its useful heat has been extracted. In yet another example, the second and first fluids can be parts of two independent thermal systems. These fluids can be chemically different. They do not come in direct contact and do not mix with each other. They enter the thermoelectric generator, generate electricity, exchange heat as well as possible and part.

Figure 3:
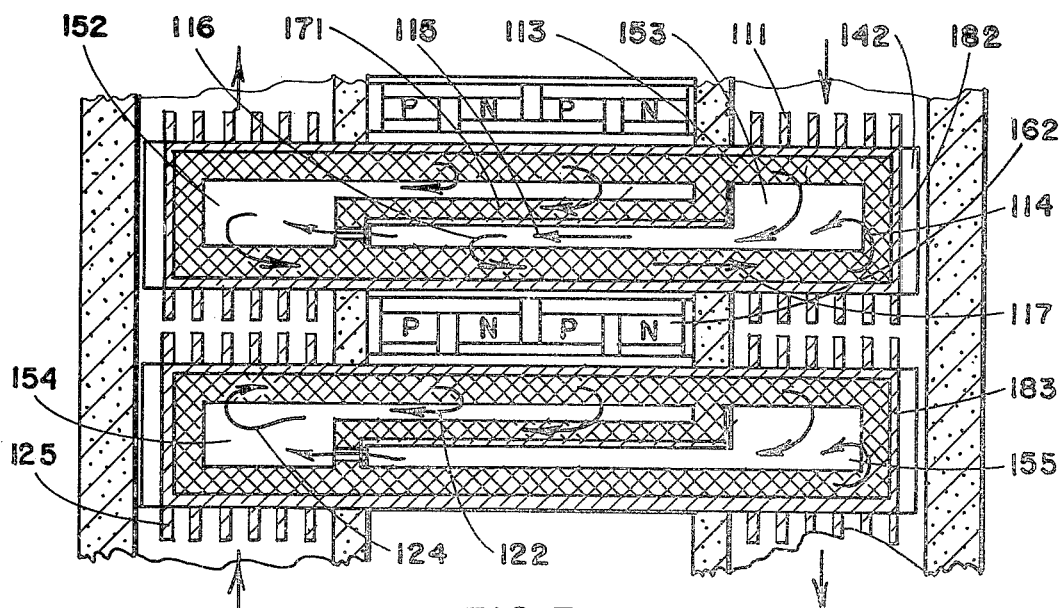
FIG. 3 is a sectional view of a part of another embodiment of the thermoelectric generator, illustrating a thermal bridge containing heat pipes exchanging heat with both fluid streams.

In FIG. 3 there is illustrated a part of another embodiment of the present invention. In this figure, thermal bridge 142 resembles thermal bridge 42 illustrated in FIGS. 1 and 2, but each of its heat pipes combines the functions of two adjacent heat pipes of the previous embodiment. Thus, heat pipe 182 combines functions of heat pipes 52 (replaced by chamber 152) and 53 (replaced by chamber 153), and similarly heat pipe 183 with its two chambers 154 and 155 is functionally equivalent to heat pipes 54 and 55. Thus, in thermal bridge 142, heat is absorbed by fins 111, which causes evaporation of the heat pipe working fluid as indicated by arrow 114. Vapor transfer is indicated by arrow 115 and arrow 116 indicates the condensation process. The return of the liquid to the evaporator is indicated by arrow 117. The heat of condensation heats the hot junctions of the thermoelements 162 while evaporation (arrow 122) in chamber 154 of the heat pipe 183 cools the cold junctions. The working fluid is then condensed (arrow 124) and the heat is transferred through a heat exchanger 125 into the second fluid stream. One wick system 113 is used for both heat pipe chambers 152 and 153 and the chambers are separated by a wall 171 made of a wick material partially lined on one side with a thin sheet metal. The same fluid circulates in both chambers, maintaining an almost constant temperature throughout.

Figure 4:
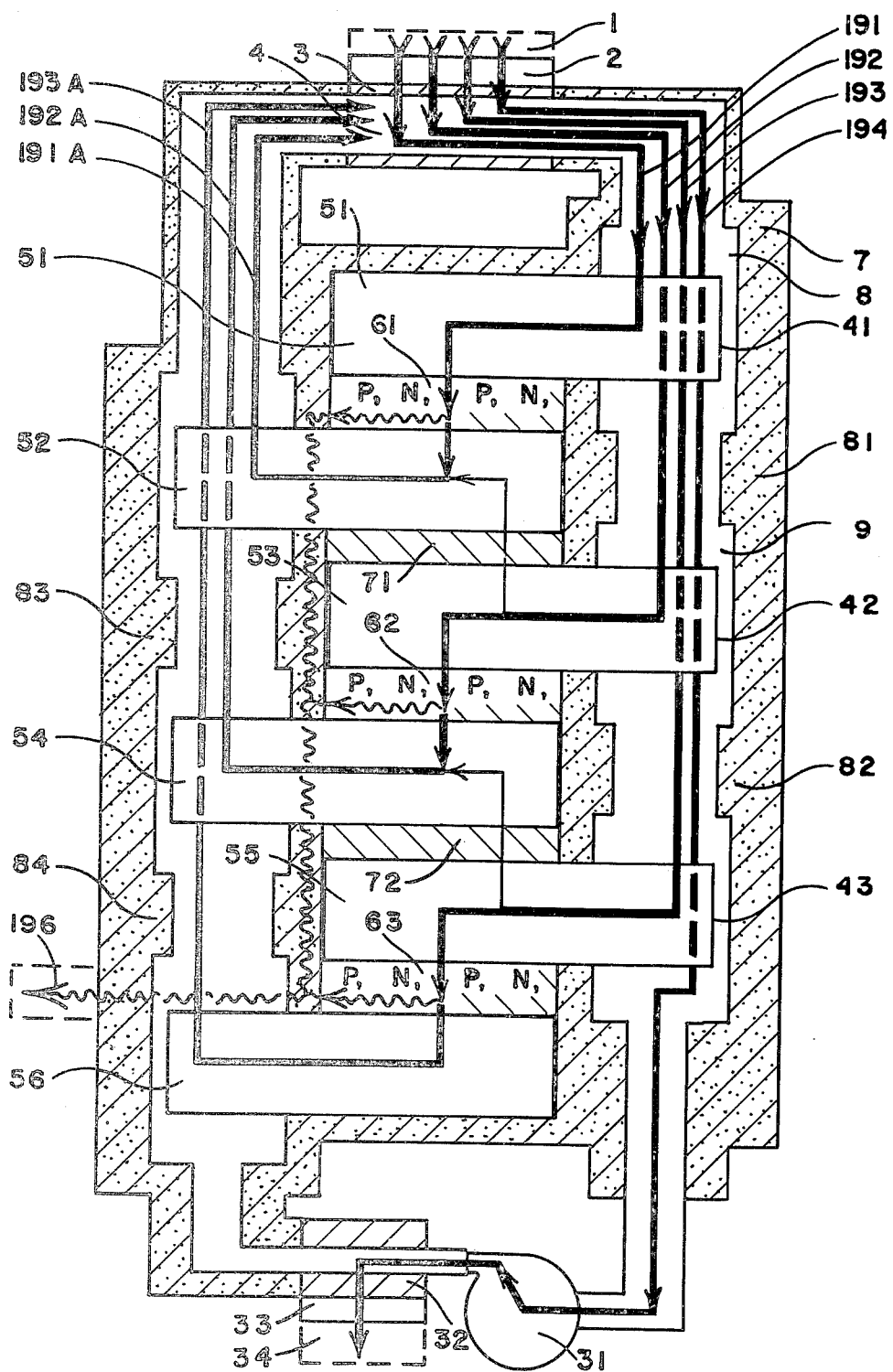
FIG. 4 is a schematic view of the thermoelectric generator shown in FIG. 1 in which the heat flow pattern is graphically illustrated.

FIG. 4 gives a further diagrammatic and simplified illustration of how the basic system given in FIG. 1 permits the recovery of heat. Consider a closed loop version of this embodiment. The first fluid carries with it heat from the heat source which is to be delivered to the three thermal bridges, plus some additional heat which was not absorbed by the bridges. Thus we can graphically represent the above four components of the heat flux by arrows 191, 192, 193, 194. Considering heat flux 191, it enters the heat pipe 51 of the thermal bridge 41, generates a small flux of electric energy (wavy arrow) due to a temperature difference ($T_{51}$–$T_{52}$) in the thermoelements 61 located between heat pipes 51 and 52. The unconverted portion of the heat flows along the heat pipe 52 represented by arrow 191A and is then transported to the heat source by the second fluid stream. The heat which was not absorbed by the first thermal bridge 41 is represented by arrows 192, 193 and 194, and it passes from chamber 8 to chamber 9, where the second thermal bridge starts. Arrow 192 represents the flow of heat from the heat source to heat pipe 53, operating at a temperature $T_{53}$ and continuing through the thermoelement 62 causing a temperature difference ($T_{53}$–$T_{54}$) and generating a flux of electric energy (wavy arrow). A small portion of heat flows upward from heat pipe 53 to heat pipe 52, through heat flow control element 71, where it joins the heat flux represented by arrow 191A. The main portion of the heat flux is represented by arrow 192A, and it flows along heat pipe 54 and then with the second fluid stream to the heat source. The heat flow represented by arrow 193 is similar to that represented by 192. A certain amount of heat succeeds in getting from the heat source to the heat sink without being absorbed by the thermal bridges. The flux of this heat is represented by arrow 194. The main component of this lost heat flux is diffusion of heat in the first fluid, paralleling the heat transport by the flow of fluid. This diffusion can be minimized through proper use of the thermal insulation means 81, 82, 83, 84, between the chambers containing the beginnings and ends of the thermal bridges. Additional thermal losses occur as in any thermal device and are minimized through proper use of standard thermal insulation. It is then clear from FIG. 4 that the efficiency of the system of the present invention is determined by the ratio of the total electric energy flux represented by arrow 196, to the said flux 196 combined with the lost heat flux represented by arrow 194, while the efficiency of a thermoelectric generator of standard design would be represented by the ratio of flux 196 to combined fluxes 191, 192, 193 and 194. Hence the efficiency of the device of the present invention is higher. The higher the number of thermal bridges, the higher the efficiency of the generator, approaching the Carnot efficiency limit, provided that all design parameters and all materials are suitably chosen, the electrical contact resistances are low and the geometry and surface area of the passages allow the work of pumping to be small.

The thermoelectric materials of the P and N thermoelements should be chosen so that they will provide maximum performance (represented by their figure of merit) at the temperature range within which they operate. Similarly, the heat pipe working fluids should be chosen for optimal performance at the temperature at which they operate. Finally, the materials of the electrodes should be chosen for compatibility with the semiconductors at the working temperature. As an illustration of the use of materials for construction of the main operating components in the generator of the present invention, consider FIGS. 1 and 4.

The generator exemplified here operates between the temperatures 185° C. and 711° C. The operating fluid is $KCl$—$SnCl_2$ eutectic and is circulating in a molten state, and represents both the first and second fluids. The heat pipe 56 operates at 190° C., exchanges heat with the second fluid, is made of copper with a copper wick and contains Freon as the working fluid. Attached to it is a set of thermoelements (thermopile) composed of P-elements made of P-materials like $Bi_2Te_3$-$Sb_2Te_3$ alloy or $Ag_2Te$-$Sb_2Te_3$ alloy, and N-elements made of N-materials like $Bi_2Te_3$-$Bi_2Se_3$ alloy or N-PbTe doped with $PbI_2$. The thermoelement electrodes are made of copper, nickel, iron and their alloys. The thermopile 63 operates between 190° C. and 365° C. In contact with 63 is a heat pipe 55, maintaining the temperature 365° C. by absorbing heat from the first fluid. It is constructed similarly to heat pipe 56. In contact with the heat pipe 55 is the heat flow control plate 72. It is a composite material made of stainless steel wires and asbestos fibers to obtain limited heat flow from the heat pipe 55 operating at 365° C. to the heat pipe 54 operating at 360° C. The heat pipe 54 is made the same way as the previous heat pipes, and rejects heat to the second fluid. In contact with 54 is the thermopile 62 operating between temperatures 360° C.

and 535° C. Its P-elements are made of materials like P-type Na doped PbTe, AgSbTe$_2$-GeTe alloy or PbTe-SnTe-MnTe alloy. Its N-elements are made of materials like N-type PbI$_2$ doped PbTe, or N-type PbTe-SnTe alloy. The thermoelement electrodes are made of tungsten, molibdenum, nickel alloys, stainless steel or pure iron. In contact with the thermopile 62 is the heat pipe 53 operating at 535° C., made of a nickel based alloy (Inconel) with the stainless steel woven wick containing potassium as a working fluid. BiCl$_2$ or P$_2$S$_5$ can also be used as fluids in silicon carbide protected containers and wicks. In contact with the above heat pipe is a second heat transfer plate 71 made of nickel-alumina cermet and attached to the heat pipe 52 operating at 530° C. made the same way as the heat pipe 53, but exposed to the second fluid stream. In contact with it is a thermopile 61 operating in the temperature range 530° C. to 705° C. Its P-thermoelements are made of thermoelectric materials like P-type Ge-Si alloy, MnSi$_2$ or Cu$_{1.97}$Ag$_{0.03}$Se$_{1.0045}$ while N-thermoelements are made of N-type Ge-Si alloy, Co-Si alloy or GdSe$_{1.48}$. The electrodes are made of tungsten, molibdenum, stainless steel, copper or copper alloys. This thermopile is in contact with the heat pipe 51 made of Inconel with a stainless steel wick, containing sodium as a working fluid, exchanging heat with the first fluid while maintaining the temperature of 705° C.

Since heat pipes were shown in conduct heat many thousands of times faster than the best conductors, like copper, of the same dimensions, the heat flow in the above described system is limited only by the thermoelements, and therefore an extremely high power density can be obtained.

Figure 5:
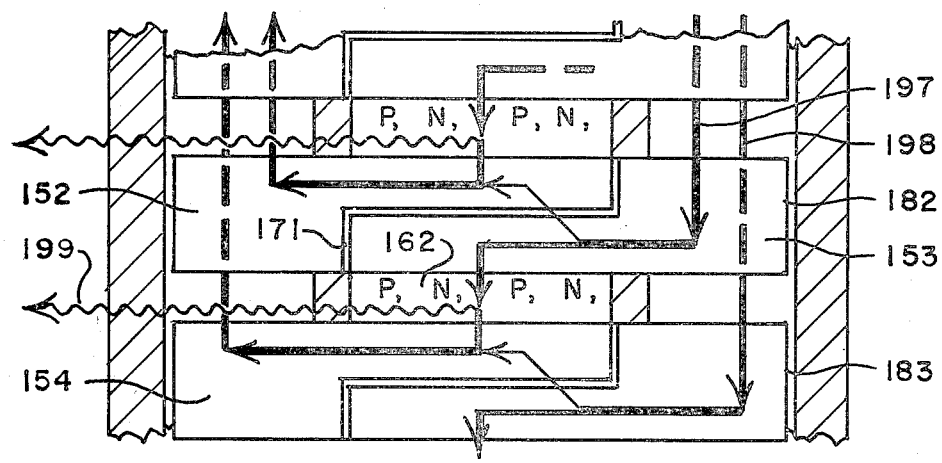
FIG. 5 is a schematic view of the thermal bridge illustrated in FIG. 3, in which the heat flow is graphically represented.

In FIG. 5 there is a schematic view of a section of the generator shown in FIG. 3. The heat flow pattern in this section is graphically represented in a similar manner as in FIG. 4. Arrow 197 represents heat entering the chamber 153 of the heat pipe 182. Most of the heat proceeds downward, producing electricity in the thermoelements 162 as indicated by wavy arrow 199. A smaller portion of heat is transferred through the wick-partition 171 into the chamber 152 and from there into the second fluid stream. A portion of the flux 197, which was not converted into electricity, enters chamber 154 of the heat pipe 183 and from there enters the second fluid stream. In a similar manner the flux 198 enters the heat pipe 183 and flows toward the thermopile located below.

Figure 6:
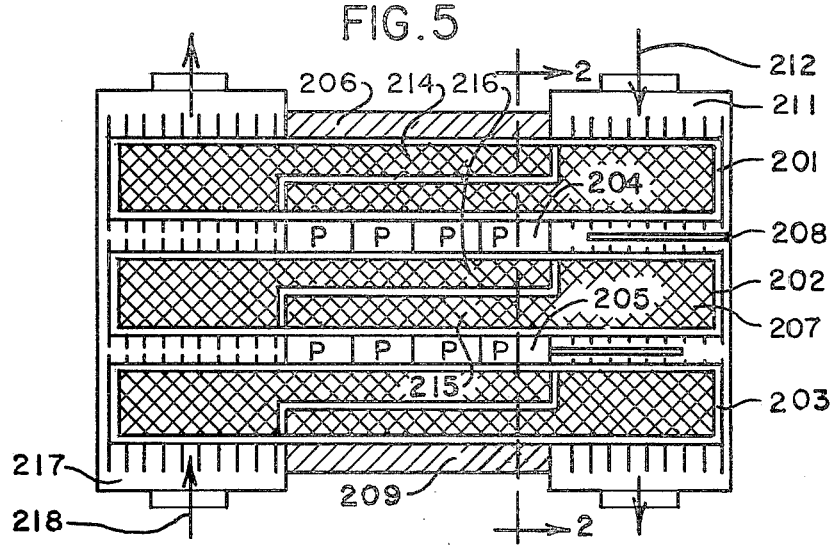
FIG. 6 is a schematic view of another embodiment of the generator, in which the thermoelectric elements are electrically connected to heat pipes.
Figure 7:
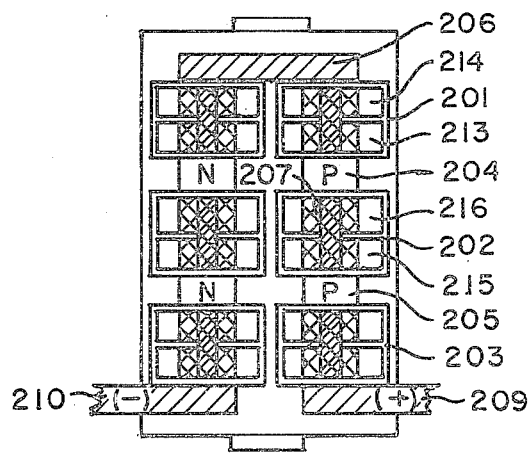
FIG. 7 is a sectional view along the line 2—2 of the thermoelectric generator shown in FIG. 6.

FIG. 6 is a schematic sectional view of another embodiment of the generator. Its main feature is that the heat pipes and thermoelements are electrically connected and hence the thermal resistance of the electrical insulation necessary in other embodiments is eliminated. This embodiment of the generator is a thermopile composed of a number of thermocouples connected electrically in series. Consider such a thermocouple which is given in FIG. 6, together with its sectional view given in FIG. 7, wherein the heat pipes 201, 202, 203 are directly electrically connected to the P-elements 204 and 205 comprising a P-leg of a thermopile. The N-leg is formed in a similar manner and is connected electrically and thermally to the P-leg with a metallic strap 206. It is important that the wick 207 of each heat pipe is arranged in relation to the neighboring thermoelements so as to provide an electrically conducting bridge of the smallest possible electrical resistance. The chambers like 214 located on the sides of the wick provide space for the vapor flow. Metallic straps 209 and 210 connect the thermocouple to the other thermocouples in the generator. The hot first fluid enters the passage 211 in the direction shown by arrow 212. It heats the pipe 201, causing evaporation of the heat pipe fluid from the wick in the chamber 213, which is separated from chamber 214 by a partition. The vapor condenses on the portion of the wick attached to the thermoelements 204, heating them, and returns to the heated portion of the heat pipe. The heat travels through the elements 204 generating electricity there and causes evaporation of the working fluid in the chamber 216. Said fluid condenses in the colder portion of the same chamber, which is in heat exchange relationship with the first fluid flowing as indicated by arrow 218 within the passage 217. The insulating partition 208 lowers the thermal diffusion in the first fluid. The other functions and relationships, as well as materials used, are similar to those previously described.

Figure 8:
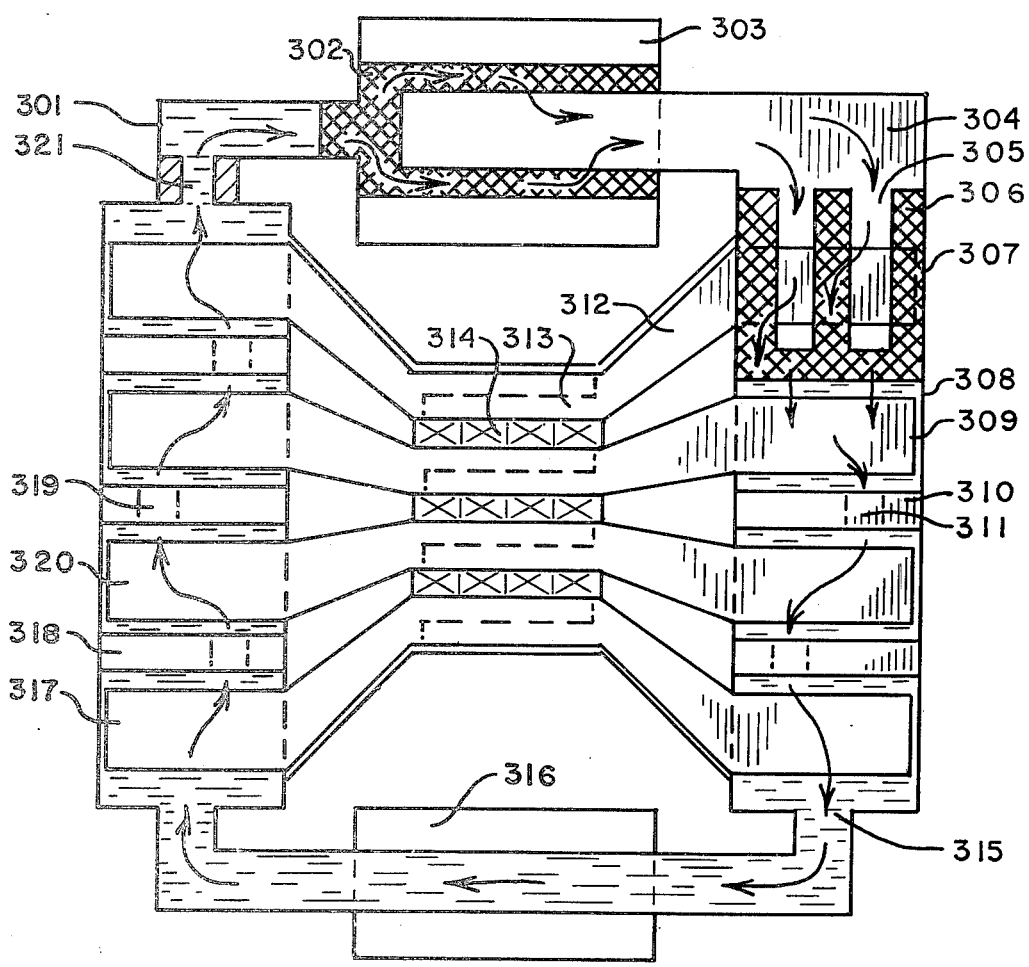
FIG. 8 is a completely sealed generator system utilizing heat pipes for all pumping functions.

In FIG. 8 a closed loop system is shown. A fluid circulating in the loop must have properties which would qualify it as a heat pipe working fluid. Preferably it should have a large difference between the melting and boiling points, high thermal stability, high surface tension, low viscosity, low density and high heat of vaporization. The fluid can be an electric conductor but in this case all heat pipes connected to the thermoelements have to be electrically insulated with protective coating to prevent shorting by the fluid. Circulation of the fluid in the system is achieved through a combination of vaporization, condensation and capillarity in a manner resembling a heat pipe. Thus, the fluid enters the capillary matrix 302 from the tube 301. The fluid, for example SnCl$_2$-KCl eutectic mixture, is already hot since it represents the second fluid which was preheated while passing through the generator. Matrix 302 is located within the heater 303. The working fluid evaporates from the matrix 302 absorbing heat from the heater, and flows through the tube 304 to the vapor condensation area 305, which is located at the hot end of the heating fluid heat exchanger of the thermoelectric generator. The thermoelectric generator used here can be of any type previously described herein. The vapor of the working fluid is condensed on the capillary matrix 306. Heat of condensation is absorbed by a heat pipe 307 and transferred through its concentrating section 312 to its section 313 which delivers heat to the thermoelectric structure 314, where it is partially converted to electricity (as described above). The liquid fluid leaves matrix 306 (which is made in the same manner and from similar materials as described in the above heat pipe matrix), and proceeds through the liquid/heat pipe exchanger 308 where it transfers its heat at lower and lower temperatures (as described above) to the series of heat pipes 309 and others. In order to decrease the heat flow from the hot end of the heat exchanger to the cold end of the heat exchanger, a number of thermally insulating partitions (310 is typical) are inserted between ends of the heat pipes, subdividing the heat exchanger into a number of chambers filled with working fluid (liquid). Each of the partitions (made, for example, of porous alumina) has a channel 311 through which the fluid flows. The chilled working fluid finally leaves the heat exchanger through the port 315. Next it proceeds to the cooler (heat sink) 316, where any heat which was not recuperated or converted to electricity is dissipated (for example, into ambient air, water or vacuum). Thus the fluid becomes the cooling fluid (liquid) and enters the cooling heat exchanger with its exposed ends of heat pipes (317, 320 are typical). The heat pipe ends operating at higher and higher temperatures are separated by thermally insulating partitions (318 is typical) with connecting channels (319 is typical). The fluid proceeds in the general direction indicated by arrows and leaves the cooling heat exchanger through the insulated port 321, and into tube 301. At this stage the cooling fluid is hot. The loop is thus closed. The details of thermoelectricity generating means (314 is typical) and the electric power outlet are not shown in the drawing. The system also must be properly thermally and electrically insulated.

The above given embodiments and examples are given for illustration of the main principles only and should not be construed as limiting the basic spirit of the invention.

I claim:

1. A method for directly converting heat to electricity in an electric generator using a plurality of thermoelectric elements and heat pipes comprising the steps of
   heating a first fluid stream at a heat source and directing said first fluid stream toward a heat sink;
   directing a cool second fluid stream toward said heat source;
   locating a plurality of thermal bridges effectively thermally insulated from each other operatively between the first and second fluid streams to effectively place the first and the second fluid streams in counterflow relationship for the direct conversion of heat to electricity by said thermal bridges;
   heat exchanging one end of the plurality of thermal bridges with the first fluid stream at successively lower temperatures thereof; and
   heat exchanging respectively the other ends of the thermal bridges with the second fluid stream at respectively successively lower temperatures thereof;
   whereby the temperature gradients inside the thermoelectric elements are generally parallel to the direction of the overall temperature drop of the fluid streams for maximization of efficient generation of electricity with high power density.

2. The method for directly converting heat to electricity as claimed in claim 1, in which heat transfer from the first fluid stream to the second fluid stream along the thermal bridge includes the following steps:
   absorbing heat from the first fluid stream by a heat pipe generally perpendicular to the direction of an overall temperature drop in the first fluid stream;
   transferring the heat along the heat pipe to its portion adjacent to and in heat exchange relation with at least one thermoelectric element;
   conducting heat along the thermoelectric element in such a manner that a gradient of temperature at a point inside the thermoelectric element is generally parallel to the direction of the overall temperature drop in the fluid streams, and converting part of the heat into electricity there;
   transferring the portion of the heat unconverted to electricity into and along another heat pipe generally perpendicular to the direction of an overall temperature drop in the first and second fluid streams;
   containing the heat flowing in the thermal bridge from the first fluid stream to the second fluid stream by controlling the heat exchange with other thermal bridges.

3. An electric generator having a hot end and a cool end wherein electricity is produced by the direct conversion of heat to electricity with thermoelectric elements and heat pipes comprising
   means for producing a heated first fluid stream flowing to the cool end of the generator;
   means for producing a cool second fluid stream flowing to the hot end of the generator;
   two conduits containing the first and the second fluid streams respectively;
   means for producing a plurality of thermal bridges formed of operatively coupled heat pipes and thermoelectric elements;
   said thermal bridges being operatively coupled in heat exchange relationship with said first and second fluid streams to effectively place said streams in counterflow relationship;
   said thermal bridges having each one end thereof in heat exchange relationship with the first fluid stream at respectively and successively lower temperatures thereof;
   wherein respectively other ends of said thermal bridges are placed in heat exchange relationship with the second fluid stream at respectively successively lower temperatures thereof; and with successive thermal bridges being effectively thermally insulated from each other
   whereby said electric generator has temperature gradients across the thermoelectric elements in generally parallel relationship with the overall temperature gradient of the fluid streams for an efficient generation of electricity with a high power density.

4. An electric generator as claimed in claim 3, wherein the said two conduits are connected and form a closed loop to allow utilization of the same substance circulating within the said conduits to perform the functions of the first and the second fluid.

5. An electric generator as claimed in claim 3, wherein the said two conduits are connected to each other by a heating chamber such as a combustor, or a radiation collector.

6. An electric generator as claimed in claim 3 wherein the said thermal bridges exchange heat with either of the fluids by means of heat pipes,
   said heat pipes being of such shape and form as to facilitate heat exchange with said fluids by means of surface corrugations, fins and the like.

7. An electric generator as claimed in claim 3 and including
   thermally insulating partitions separating the said conduits into chambers,
   each chamber containing one end of at least one heat pipe.

8. An electric generator as claimed in claim 3, wherein the thermoelements are located between at least two heat pipes,
   said heat pipes being situated between two fluids in such a way that one end of each heat pipe is immersed in the first fluid while the other end is immersed in the second fluid and
   wherein the interior of each said heat pipe is divided into at least two chambers by means of an elongated, thermally insulating partition
   said two chambers each containing similar components as individual and complete heat pipes.

9. An electric generator for direct conversion of heat to electricity with thermoelements and heat pipes as claimed in claim 3 wherein said heat pipes selectively electrically interconnect the said thermoelements, allowing a continuity of flow of generated electric current across the generator.

10. An electric generator as claimed in claim 3 including mechanical means of pumping the first and the second fluid across the system.

11. An electrical generator as claimed in claim 3 and wherein two ducts containing the first and the second fluid are interconnected at their cold ends and the hot ends of the ducts are connected by the pumping means wherein the pumping of a fluid capable of existing in the generator in liquid or in vaporized form is accomplished by a combination of evaporation and condensation;
wherein said pumping means comprise
a capillary matrix,
said matrix performing the function of a wick delivering the fluid in its liquid form to the evaporator;
an evaporator,
said evaporator absorbing heat from the heater and converting the liquid form of the fluid into vapor;
a conduit directing the vapor to a condenser;
a condenser;
said condenser converting the vapor into the liquid form of the fluid;
a heat transfer means,
said heat transfer means in contact with the said condenser and collecting the heat of condensation and transferring it into the selected thermal bridges.

* * * * *